United States Patent [19]

Brewer et al.

[11] Patent Number: 4,556,952
[45] Date of Patent: Dec. 3, 1985

[54] REFRESH CIRCUIT FOR DYNAMIC MEMORY OF A DATA PROCESSOR EMPLOYING A DIRECT MEMORY ACCESS CONTROLLER

[75] Inventors: James A. Brewer, Delray Beach, Fla.; Lewis C. Eggebrecht, Rochester, Minn.; David A. Kummer; Patricia P. McHugh, both of Boca Raton, Fla.

[73] Assignee: International Business Machines Corporation, Armonk, N.Y.

[21] Appl. No.: 292,075

[22] Filed: Aug. 12, 1981

[51] Int. Cl.⁴ .............................................. G06F 13/00
[52] U.S. Cl. ..................................... 364/900; 365/222
[58] Field of Search ... 364/200 MS File, 900 MS File, 364/200, 900; 365/63, 222

[56] References Cited

U.S. PATENT DOCUMENTS

| | | | |
|---|---|---|---|
| 4,137,565 | 1/1979 | Mager et al. | 364/200 |
| 4,158,883 | 6/1979 | Kadono et al. | 364/200 |
| 4,218,753 | 8/1980 | Hendrie | 364/900 |
| 4,317,169 | 2/1982 | Panepinto et al. | 364/200 |

OTHER PUBLICATIONS

"Memory Systems Design and Applications" Hayden Book Company, McCormick, pp. 181–184.

*Primary Examiner*—Gareth D. Shaw
*Assistant Examiner*—Jonathan C. Fairbanks
*Attorney, Agent, or Firm*—Sughrue, Mion, Zinn, Macpeak & Seas

[57] ABSTRACT

In a data processing system including a dynamic RAM (14) and a programmable, prioritized direct memory access (DMA) controller (16) having a plurality of channels, the highest priority channel (0) is dedicated to a memory refresh operation. The system clock (P CLK) from the CPU (12) is applied to a divider counter (22) which produces a refresh clock (R CLK) having a period sufficient to generate the minimum number of refresh cycles within the minimum period required to refresh the RAM (14). The refresh clock (R CLK) is used to set a "D-type" latch (24) whose output, in turn, sets the highest priority DMA channel (0) request line (DREQ0), thereby initiating a memory refresh cycle. The latch (24) is cleared by the DMA acknowledge signal (DACK0) indicating the cycle is completed.

2 Claims, 1 Drawing Figure

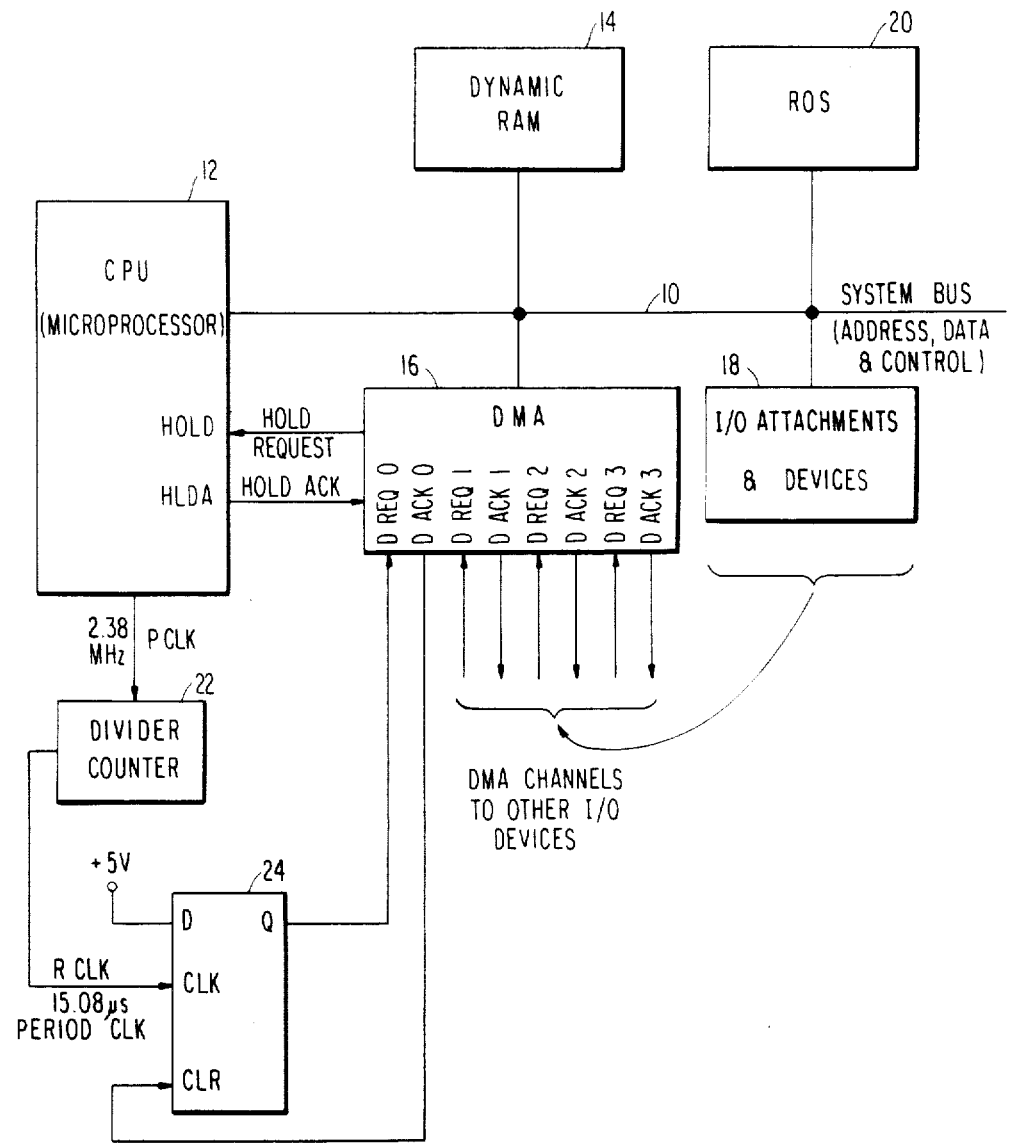

REFRESH CIRCUIT FOR DYNAMIC MEMORY OF A DATA PROCESSOR EMPLOYING A DIRECT MEMORY ACCESS CONTROLLER

TECHNICAL FIELD

This invention relates generally to the field of control circuits for refreshing dynamic or volatile memories in data processing systems and, more particularly, to a refresh circuit for the dynamic memory of a personal computer which includes a plural channel direct memory access (DMA) controller.

The invention utilizes the existing DMA controller to perform the dynamic memory refresh operation, thus reducing the complexity and cost of the computer or data processing system.

BACKGROUND OF THE INVENTION

It is well known that dynamic or volatile semiconductor memories employed as the main memory of an electronic data processing or computer system, for example, a microcomputer, must be periodically refreshed in order to prevent volatilization of the contents of the memory. However, in the past, this refresh function has been provided by special refresh control logic which periodically generates refresh read cycles. Such control logic typically contains the following functions and/or circuits:

arbitration of requests from the central processing unit (CPU) for memory cycles and refresh requests for memory cycles;

a refresh address register and counter; and

Circuits for multiplexing the refresh address onto the memory address bus.

The prior art is replete with such special refresh control circuits, as exemplified by the following U.S. Pat. Nos. 3,999,170; 4,142,233; 4,158,883; 4,185,323; and 4,207,618.

SUMMARY OF THE INVENTION

The present invention eliminates the complex special refresh control circuit used in the prior art and provides means for performing the required refresh operations by using a spare channel of the normally existing DMA controller, together with a minimum amount of logic and special programming.

For a better understanding of the present invention, together with other and further advantages and features thereof, reference is made to the following description taken in connection with the accompanying drawings, the scope of the invention being pointed out in the appended claims.

BRIEF DESCRIPTION OF THE DRAWINGS

The single FIGURE is a logic block diagram of the preferred embodiment of the invention.

DESCRIPTION OF THE PREFERRED EMBODIMENT

In small computers and data processors, such as a so-called personal computer, it is particularly important to minimize the complexity and cost of the hardware required to perform all desired functions. Thus, the drawing illustrates a preferred embodiment of the invention wherein a spare channel of an existing direct memory access (DMA) controller is used to provide the refresh function for the dynamic read/write memory in such a computer or data processor.

More particularly, a system bus 10, having address, data and control lines, interconnects the basic components of the computer or the data processing system to provide for the necessary transfer of address, data and control signals among these components. The components include, for example a central processing unit (CPU) 12, a dynamic random access memory (RAM) 14, a four-channel programmable DMA controller 16, a plurality of input/output (I/O) attachments and devices 18 and a read-only storage (ROS) 20.

In this preferred embodiment, the CPU 12 is an Intel microprocessor 8088 which is fully disclosed in "The 8086 Family Users's Manual, October 1979", published by Intel Corporation, Santa Clara, Calif. The DMA controller is an Intel 8237 high performance programmable DMA controller also fully disclosed in the above Intel Corporation publication. Each channel of the DMA controller 16 contains a starting address pointer and a transfer count register, and, furthermore, the channels are prioritized with channel 0 having the highest priority. RAM 14 is any conventional dynamic memory, such as TI 4116. ROS 20 is also conventional and may be a Mostek MK 36000, for example.

In this invention, channel 0 is dedicated to the memory refresh cycles, while channels 1, 2 and 3 are dedicated to the I/O attachments and devices 18. When a channel of the DMA controller 16 receives a direct memory access request (DREQ), it outputs an acknowledgment (DACK) signal when the requested memory cycle is granted. According to this invention, only two components are added in order to provide a memory refresh cycle via channel 0 of the DMA controller 16. These components are a divider counter 22 and a D-type latch 24 (a 74LS74 dual D-type positive edge-triggered flipflop) connected between the CPU 12 and channel 0 of the DMA controller.

Dynamic memory circuits require periodic refresh cycles at specific memory locations to maintain valid information. RAM 14 is a typical 16K by 1 dynamic memory chip, having cells laid out in row and column fashion which, according to the manufacturer's specification, requires 128 refresh read cycles in a 2ms period, and the 128 cycles must access all of the first 128 memory locations at least once.

As already pointed out above, this refresh function is normally provided by a special refresh control logic circuit coupled to the system bus 10. However, in this invention the refresh function is performed by channel 0 of the existing DMA controller 16 whose other channels are used to perform high speed data transfers between the I/O attachments 18 and dynamic RAM 14. Since the DMA controller 16 contains many of the same functions as the prior art refresh control circuits, i.e. memory address register and counter, CPU and DMA cycle arbitration, and CPU/DMA address bus multiplexer, the inventors have discovered that it is possible to utilize one of the DMA channels as a memory refresh controller.

According to the invention, the highest priority DMA channel 0 is programmed in auto-load mode such that, after completing 128 cycles, it automatically starts over and performs the same 128 cycles. This function is continuously repeated, the address is set up to start at 0 and increment to 127, and the mode is set up to read from memory and to write to a non-existing I/O device. Thus, all the refresh functions are simulated by DMA channel 0, the actual request for a refresh cycle (DMA cycle) being generated by a counter or a channel of a timer counter.

As shown in the FIGURE, the 2.38 MHz system clock P CLK is divided by the divider counter 22 to produce a 15.08 μs period clock R CLK. The function of the divider counter 22 may be implemented by a frequency divider and a programmable interval timer such as an Intel 8253. This 15.08 μs period clock R CLK is applied to the CLK input of the D-type latch 24 periodically to set the latch whose Q output, in turn, sets the DMA channel 0 request line DREQ0, thereby issuing a HOLD REQUEST to the CPU and initiating a DMA (refresh) cycle. The "D" latch is cleared or reset by the DMA signal DACKO, thereby acknowledging that the DMA refresh cycle is being performed. This operation is repeated on every positive edge of the 15.08 μs period clock signal R CLK.

Since the programmable DMA controller 16 is programmed for a continuous dummy read cycle starting at address 0 and going to 127, resetting to 0, and then repeating, the memory refresh function is automatically performed by the DMA controller of the computer or data processing system, without the need for a special refresh control circuit as was required in the prior art. A small ROS set-up program, which is entered upon power-up, initializes the DMA controller 16 and the timer in divider counter 22 prior to performing a memory cycle on the dynamic RAM 14. Furthermore, the DACKO signal from the DMA controller 16 can be sent to any dynamic storage in the system as a signal that a valid memory refresh cycle is on the system bus 10.

While there has been described what is at present considered to be the preferred embodiment of this invention, it will be obvious to those skilled in the art that various changes and modifications may be made therein without departing from the invention, and it is, therefore, intended to cover all such changes and modifications as fall within the true spirit and scope of the invention.

We claim:

1. In a data processing system having a common system bus for transferring address, data and control information among a central processing unit which produces a system clock signal, a programmable direct memory access controller which has a plurality of prioritized channels; a plurality of input/output devices connected to said common system bus; and a dynamic memory coupled to said common system bus which requires periodic refreshing within predetermined minimum time intervals;

the improvement comprising apparatus for refreshing said memory, comprising:

memory refresh request signal generating means, coupled between the central processing unit and the highest priority channel of the direct memory access controller, and responsive to the system clock signal for periodically applying memory access request signals to said highest priority channel to initiate memory refresh cycles in said memory by said direct memory access controller via said common system bus within said predetermined minimum time intervals.

2. The improvement of claim 1 wherein said refresh request signal generating means comprises: divider counter means, coupled to the central processing unit, and responsive to said system clock signal for generating a refresh clock signal having said predetermined time intervals; and latch means, coupled between said divider counter means and said highest priority channel, and responsive to the refresh clock signal for applying the refresh request signals to said highest priority channel; said latch means being periodically set by the refresh clock signal, and reset by an acknowledge signal from the direct memory access controller at the completion of each refresh cycle.

* * * * *

Disclaimer 4,556,952.—*James A. Brewer*, Delray Beach, Fla.; *Lewis C. Eggebrecht*, Rochester, Minn.; *David A. Kummer; Patricia P. McHugh*, both of Boca Raton, Fla. REFRESH CIRCUIT FOR DYNAMIC MEMORY OF A DATA PROCESSOR EMPLOYING A DIRECT MEMORY ACCESS CONTROLLER. Patent dated Dec. 3, 1985. Disclaimer filed Apr. 12, 1990, by the assignee, International Business Machines Corporation.

The term of this patent subsequent to March 5, 1990, has been disclaimed.
[*Official Gazette September 18, 1990* ]